(12) United States Patent
Ahn et al.

(10) Patent No.: US 12,082,356 B2
(45) Date of Patent: Sep. 3, 2024

(54) ROLLABLE DISPLAY DEVICE

(71) Applicant: LG ELECTRONICS INC., Seoul (KR)

(72) Inventors: Youngjoon Ahn, Seoul (KR); Jaeyong Kim, Seoul (KR); Changshik Minn, Seoul (KR); Kwaneun Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 326 days.

(21) Appl. No.: 17/629,969

(22) PCT Filed: Jul. 29, 2019

(86) PCT No.: PCT/KR2019/009407
§ 371 (c)(1),
(2) Date: Jan. 25, 2022

(87) PCT Pub. No.: WO2021/020605
PCT Pub. Date: Feb. 4, 2021

(65) Prior Publication Data
US 2022/0346249 A1 Oct. 27, 2022

(51) Int. Cl.
*H05K 5/02* (2006.01)
*H05K 5/00* (2006.01)

(52) U.S. Cl.
CPC ......... *H05K 5/0217* (2013.01); *H05K 5/0018* (2022.08)

(58) Field of Classification Search
CPC .............................. H05K 5/0217; H05K 5/0018
See application file for complete search history.

(56) References Cited

U.S. PATENT DOCUMENTS

| | | | |
|---|---|---|---|
| 10,742,784 B1* | 8/2020 | Jo | H04M 1/0268 |
| 2010/0134873 A1* | 6/2010 | van Lieshout | G02F 1/133305 428/411.1 |
| 2014/0194165 A1* | 7/2014 | Hwang | G06F 3/147 455/566 |
| 2015/0289397 A1* | 10/2015 | Kim | G02F 1/133308 361/679.01 |
| 2016/0054758 A1 | 2/2016 | Han | |
| 2016/0163241 A1 | 6/2016 | Lee et al. | |
| 2016/0209879 A1* | 7/2016 | Ryu | G06F 1/1652 |
| 2017/0344073 A1* | 11/2017 | Kang | G09F 9/301 |
| 2018/0212170 A1 | 7/2018 | Shin et al. | |
| 2020/0192434 A1* | 6/2020 | Huang | G06F 1/1681 |
| 2020/0396850 A1* | 12/2020 | Kim | G09F 9/301 |
| 2021/0029839 A1* | 1/2021 | Kwon | H05K 5/03 |
| 2021/0407336 A1* | 12/2021 | Chen | H10K 59/40 |

* cited by examiner

*Primary Examiner* — Michael A Matey
(74) *Attorney, Agent, or Firm* — Birch, Stewart, Kolasch & Birch, LLP

(57) ABSTRACT

The present disclosure relates to a rollable display device comprising: a roller; a display part on which the roller rolls and which comprises a display panel and a module cover adjoining and facing the display panel; a supporter fixed to an end portion of the display part; a link assembly comprising an upper link rotatably mounted on the supporter and a lower link connected to the upper link through a joint; and a motor assembly for rotating the lower link; wherein the module cover comprises a first skin and a second skin facing the first skin and having a buckling stress greater than that of the first skin, and the module cover is joined to the display panel so that the second skin thereof faces the display panel.

19 Claims, 20 Drawing Sheets

[Fig. 1]
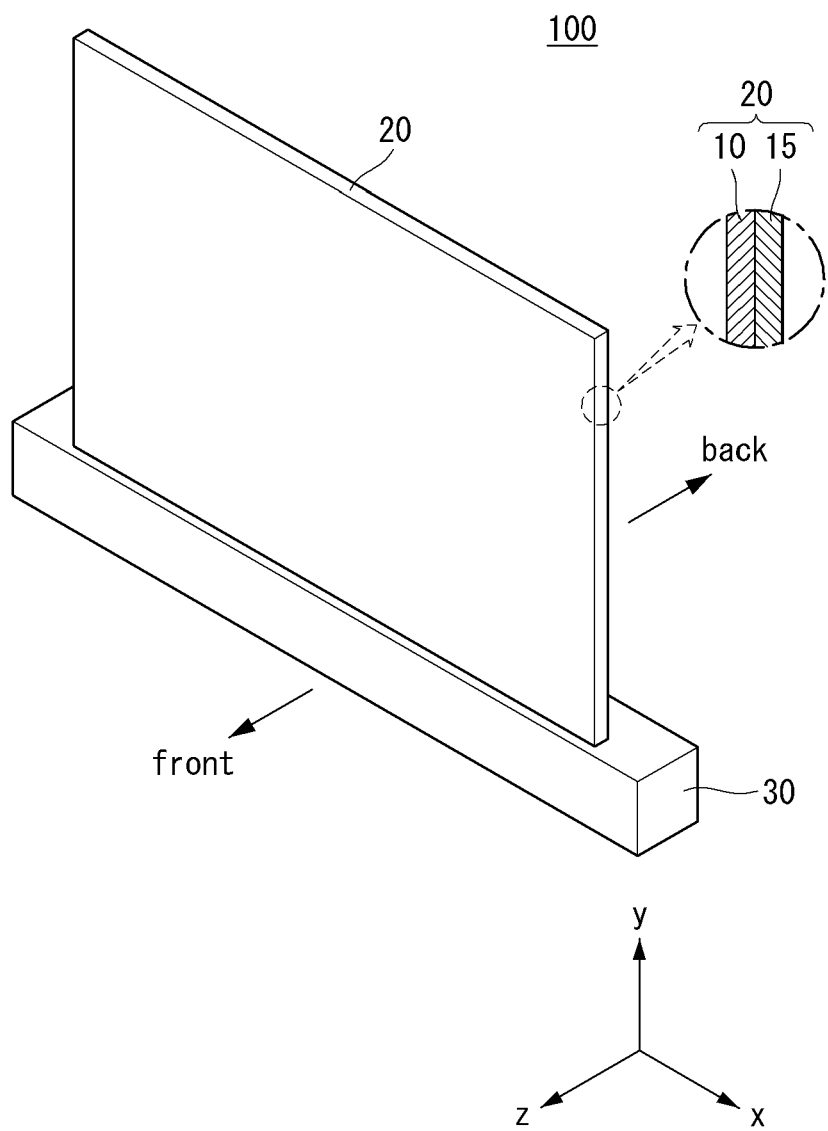

[Fig. 2]
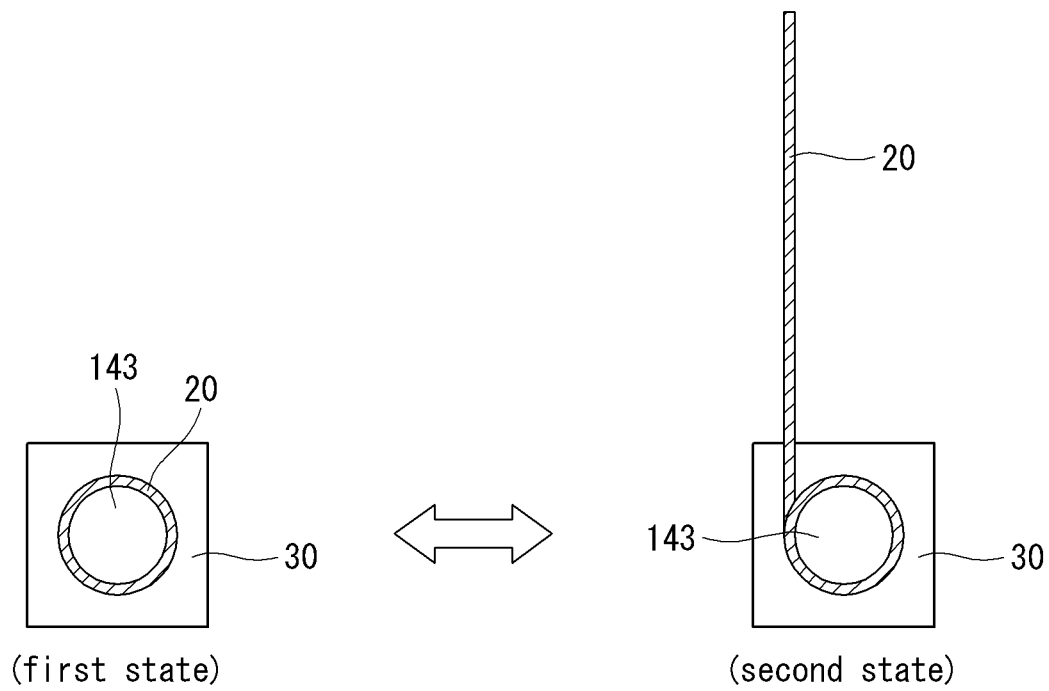

[Fig. 3]
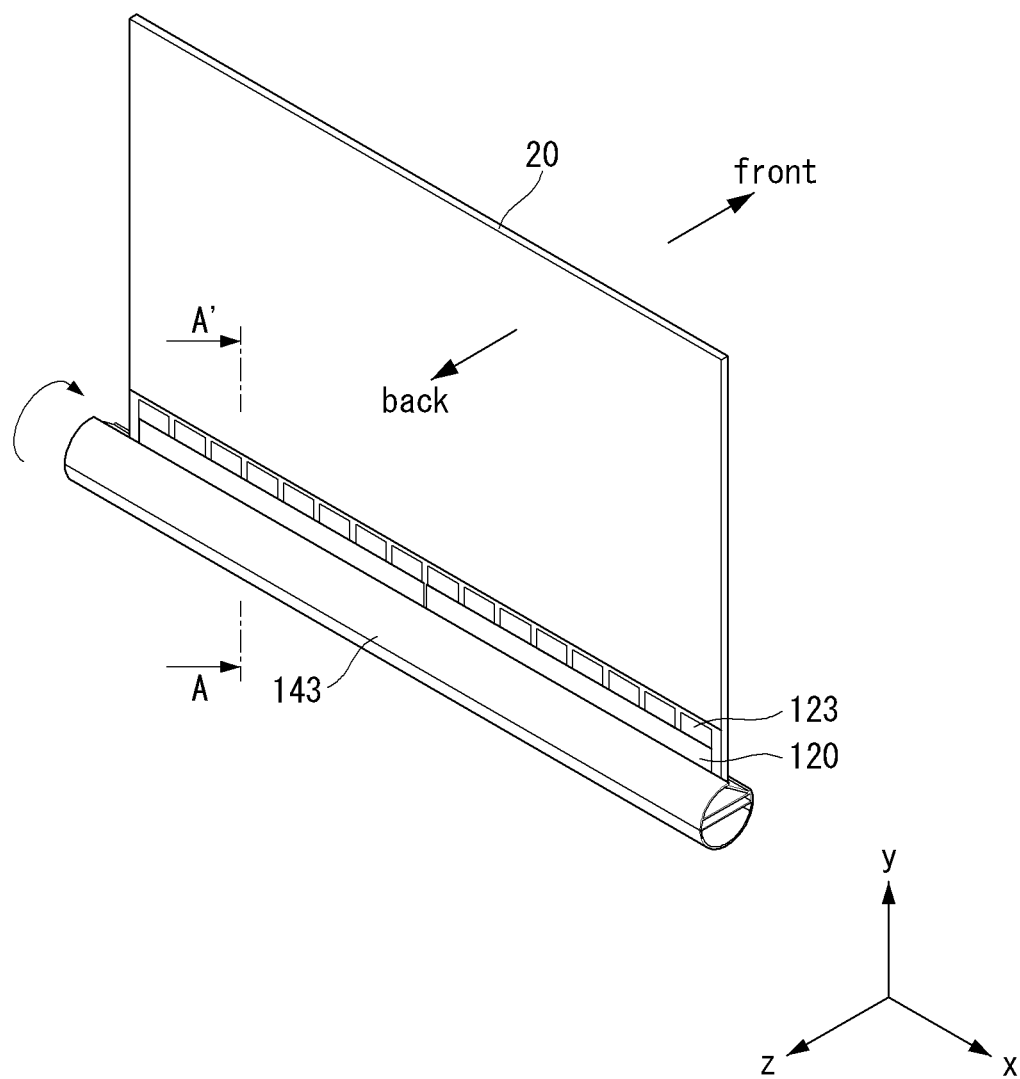

[Fig. 4]
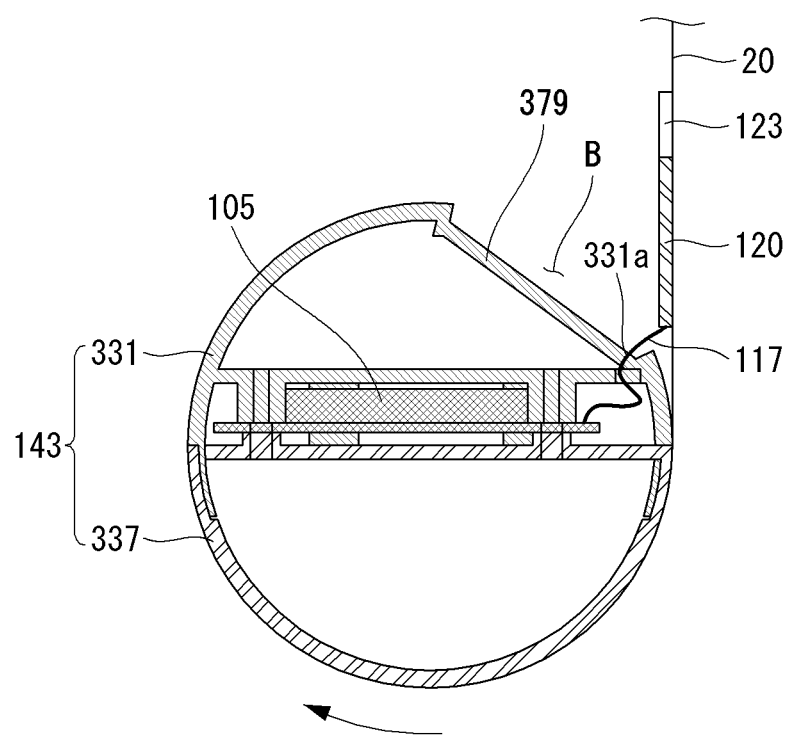

[Fig. 5]
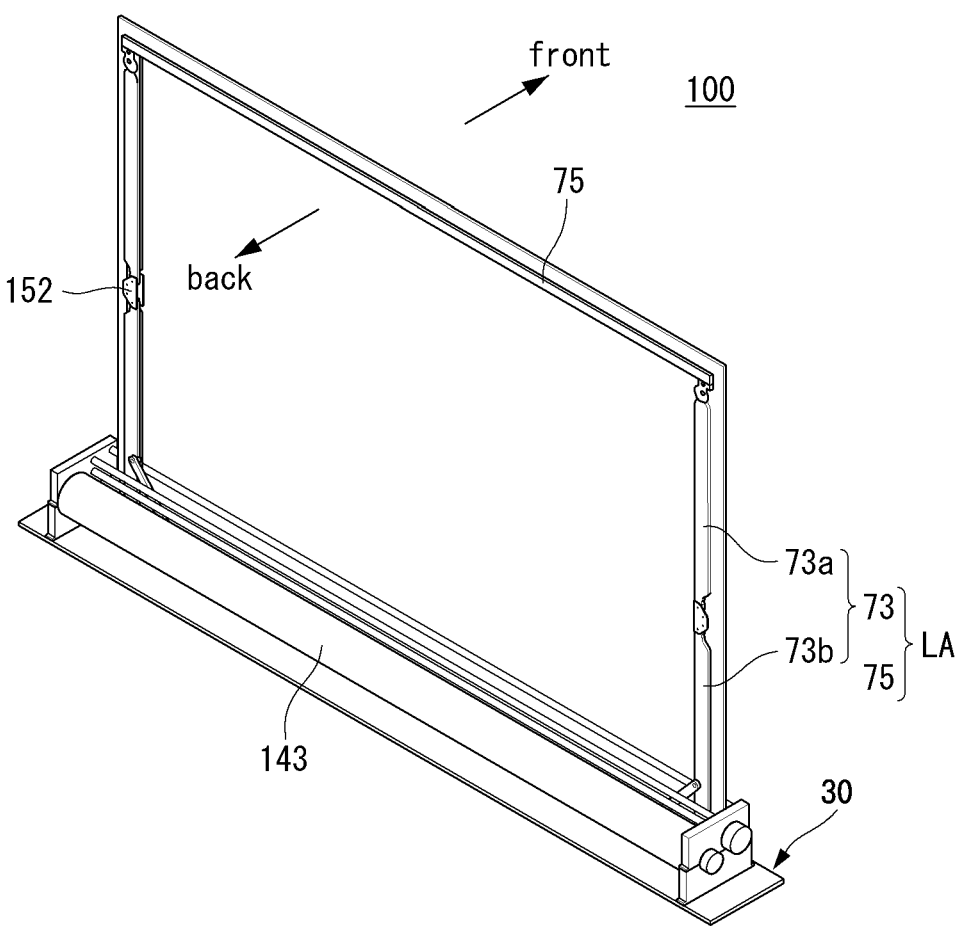

[Fig. 6]
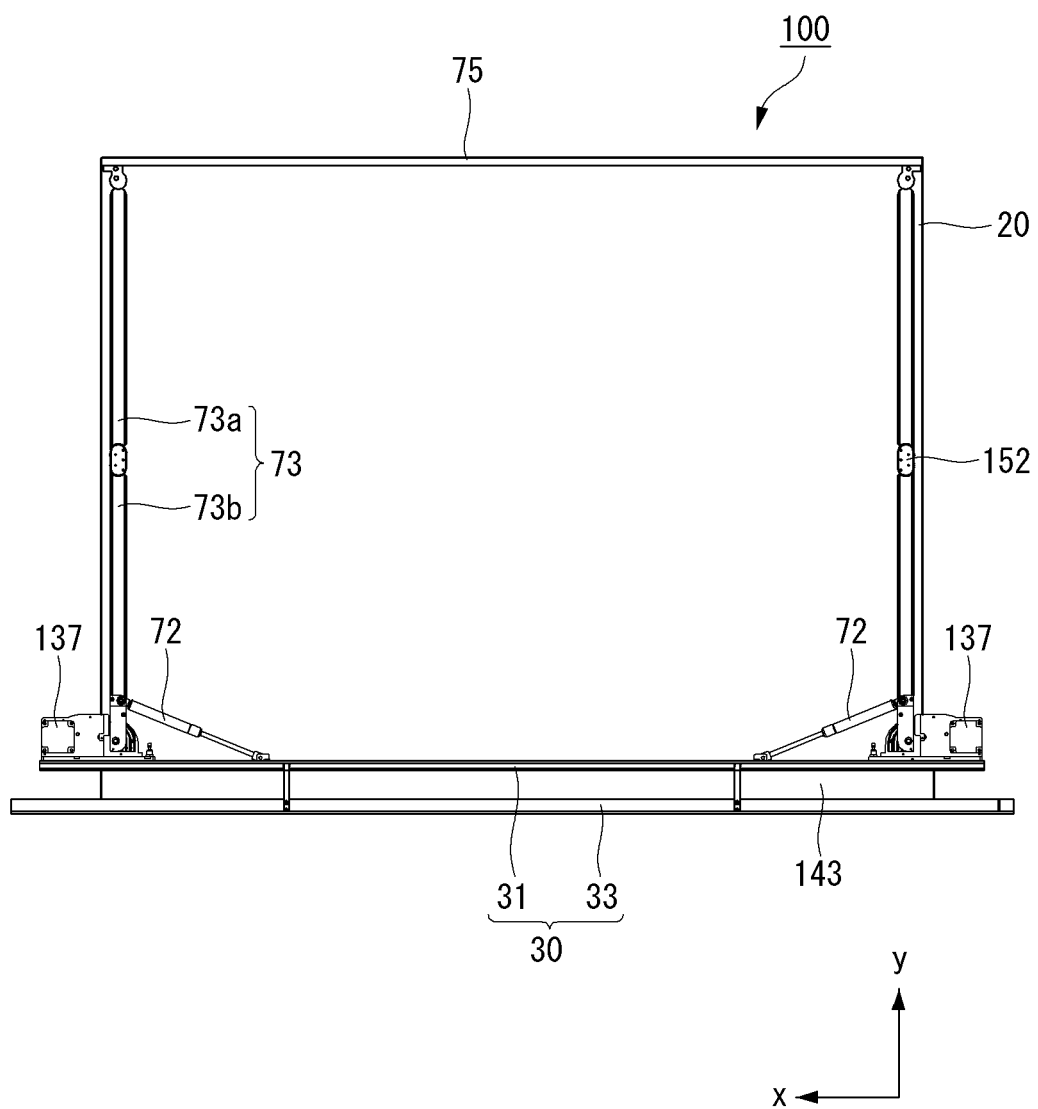

[Fig. 7]
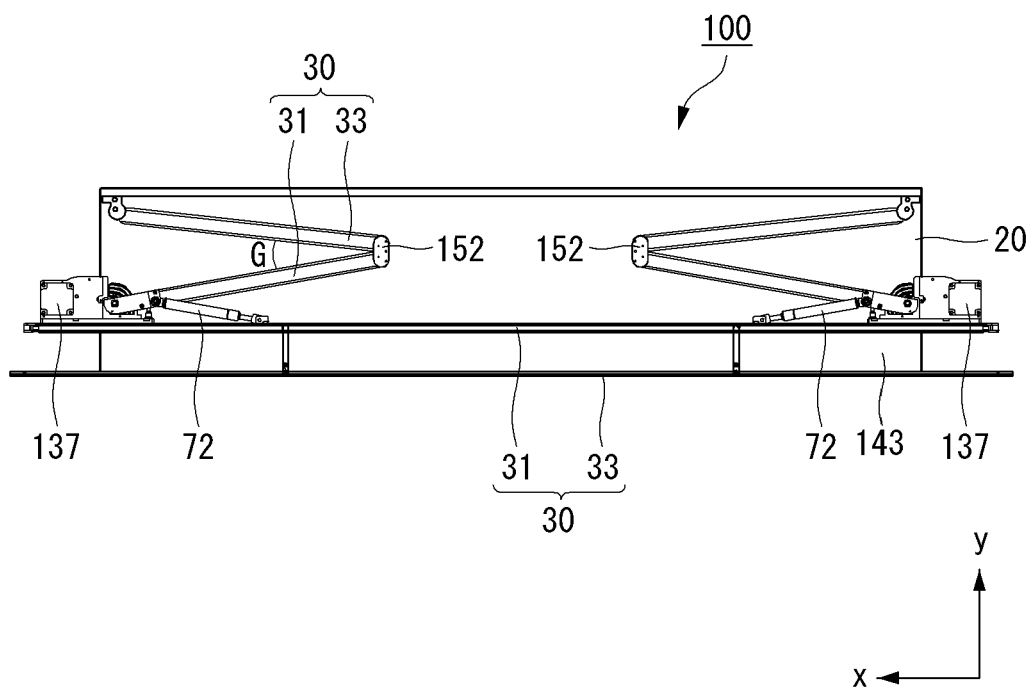

[Fig. 8]
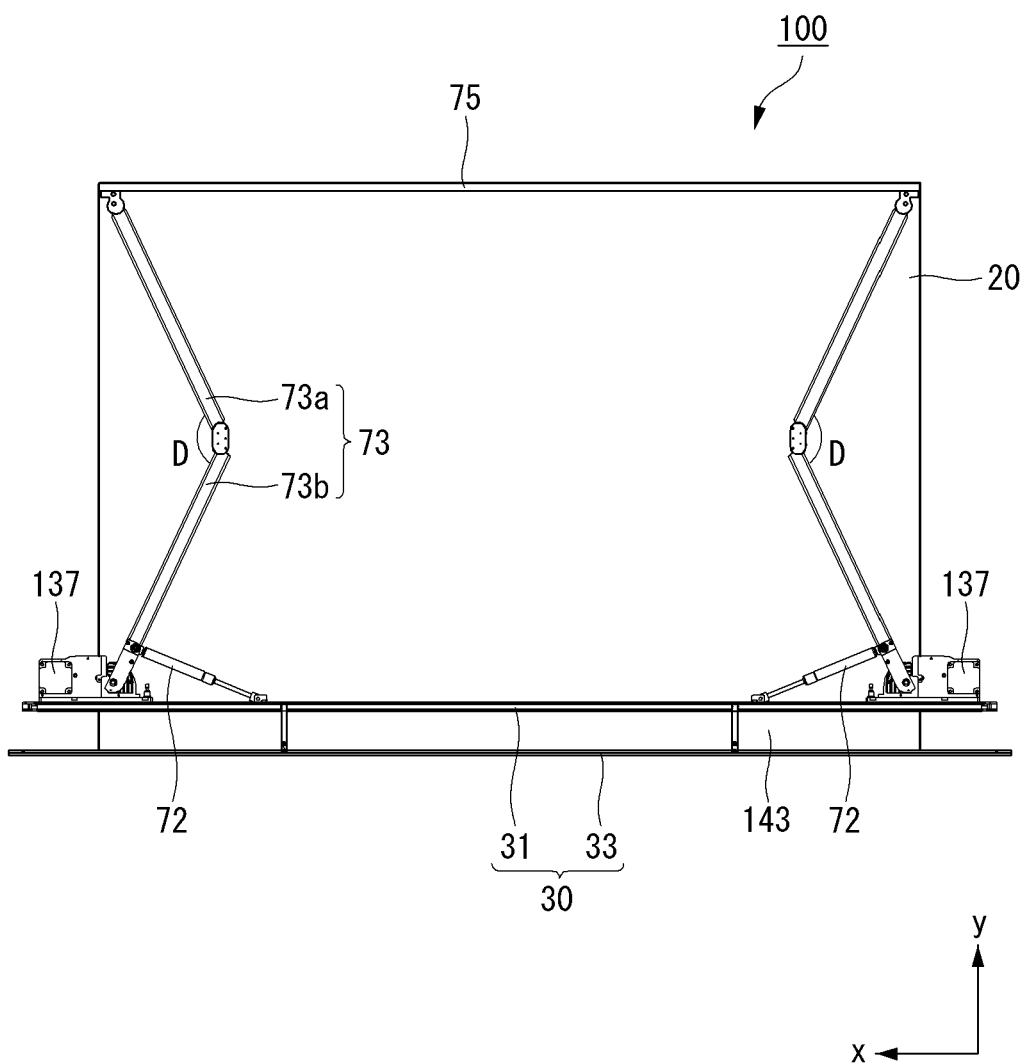

[Fig. 9]
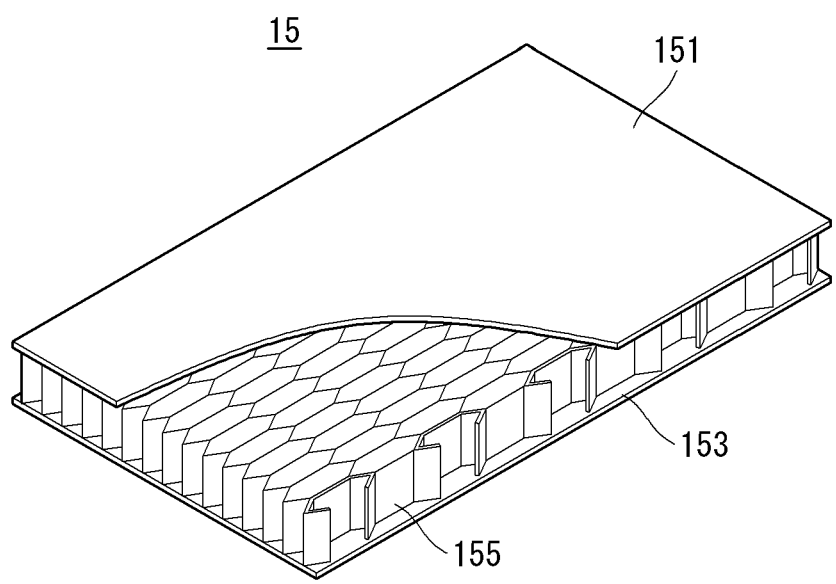

[Fig. 10]
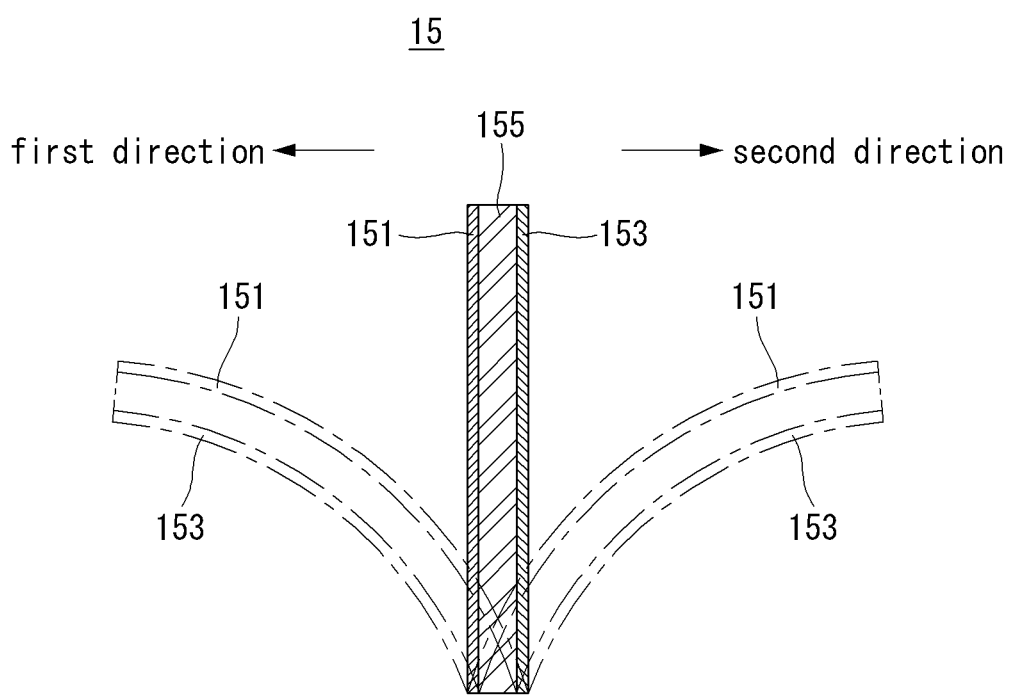

[Fig. 11]
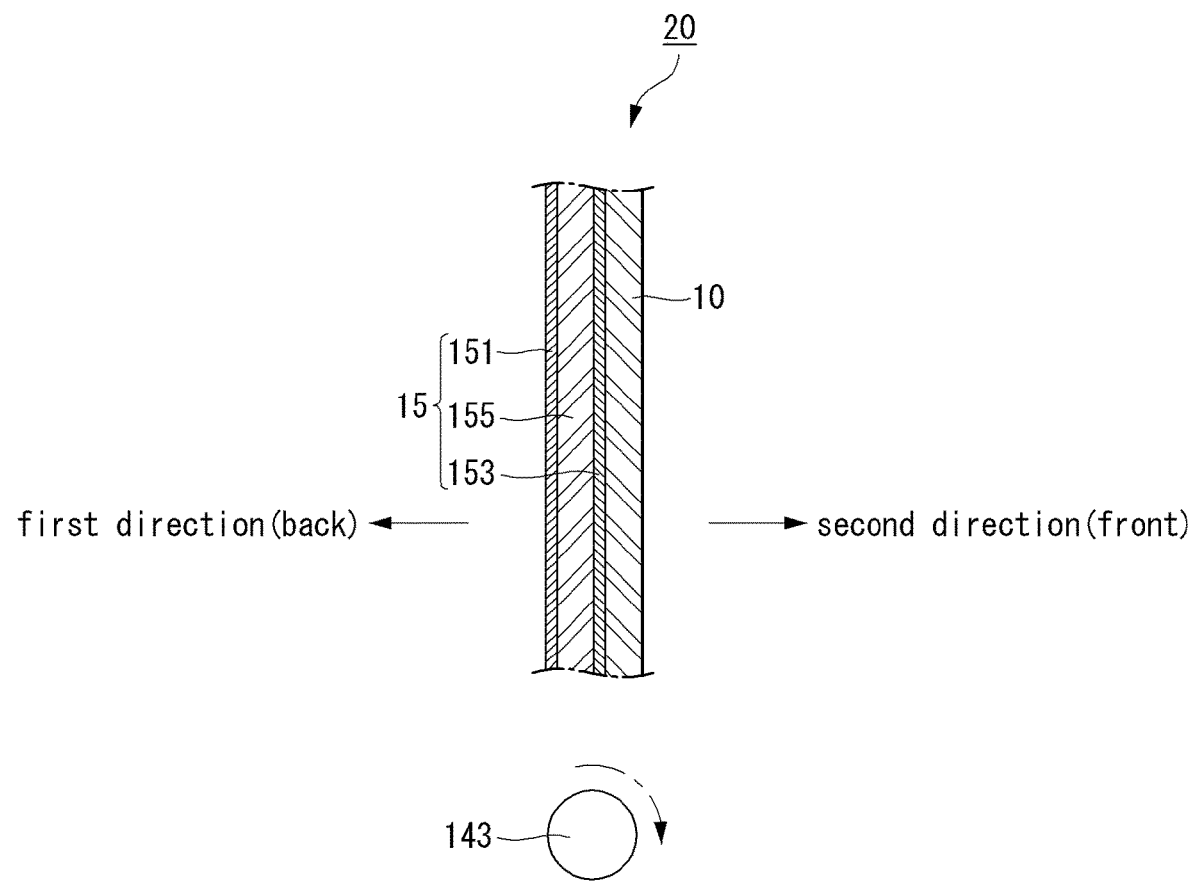

[Fig. 12]
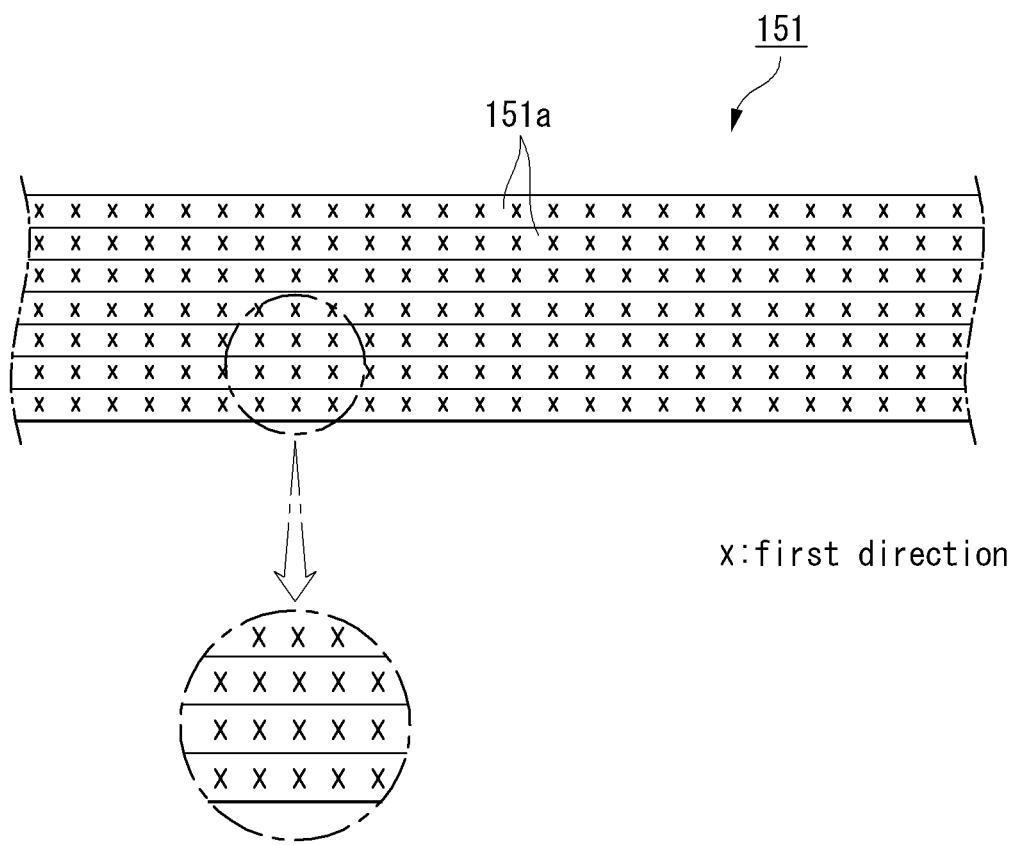

[Fig. 13]
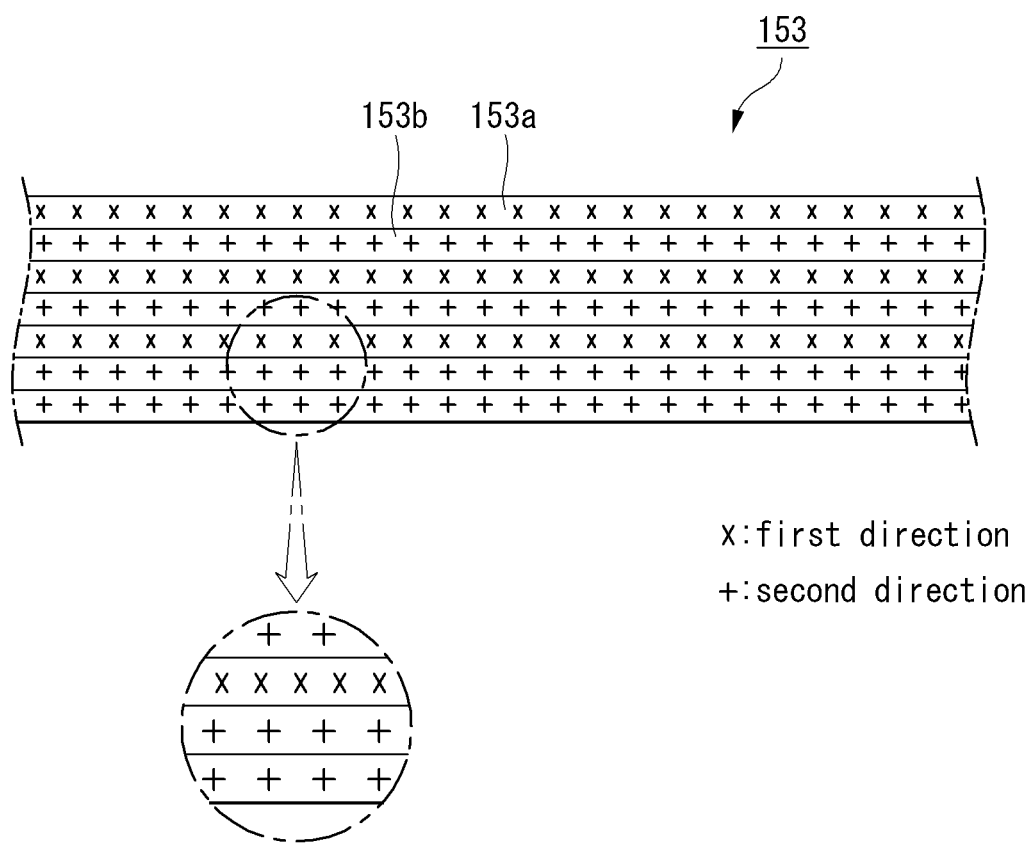

[Fig. 14]
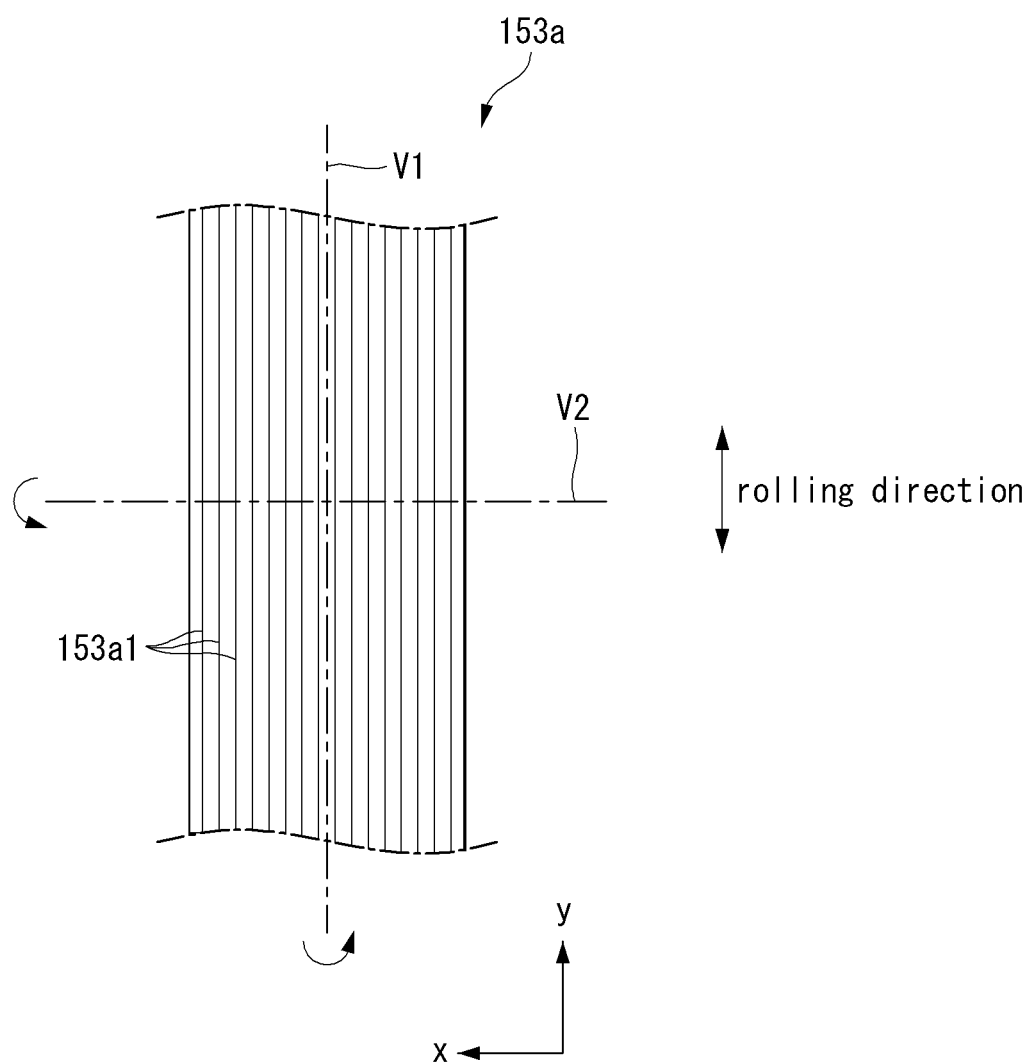

[Fig. 15]
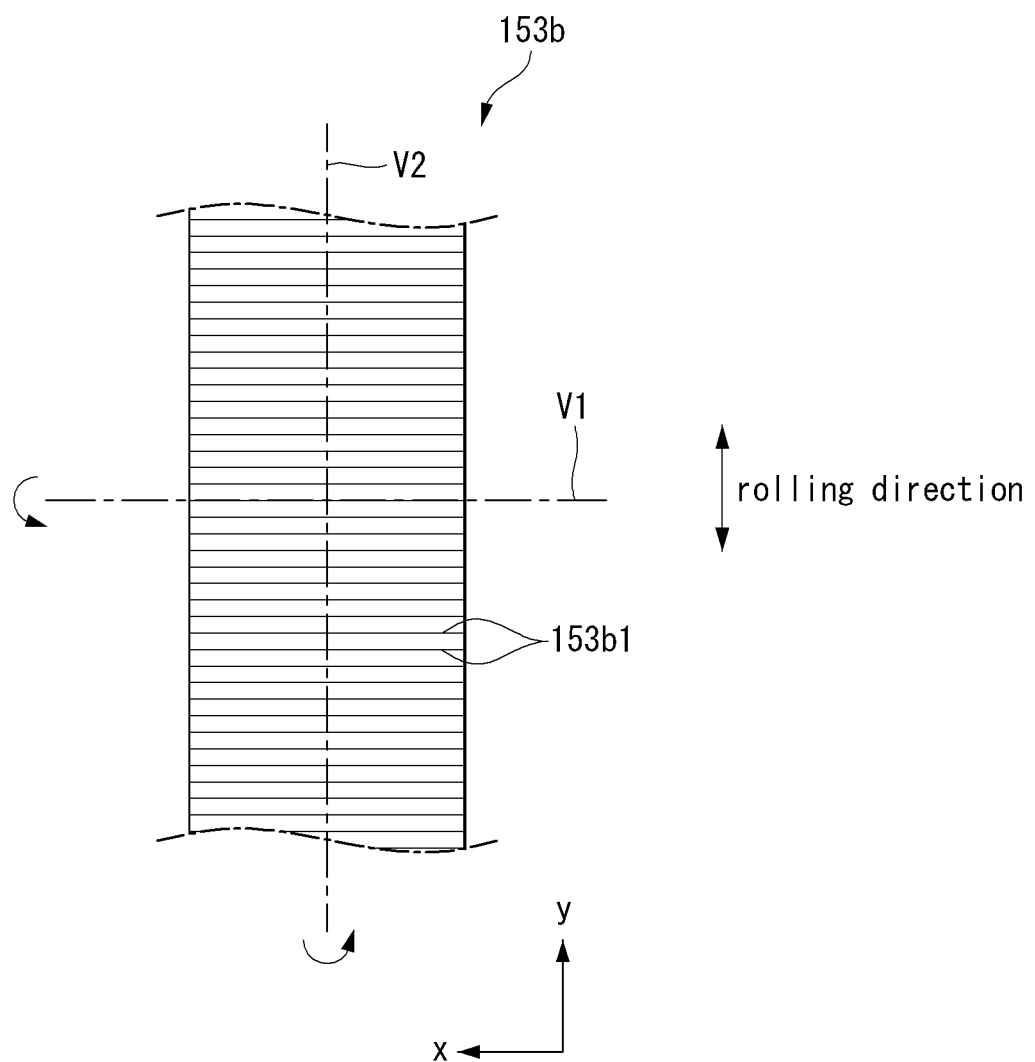

[Fig. 16]
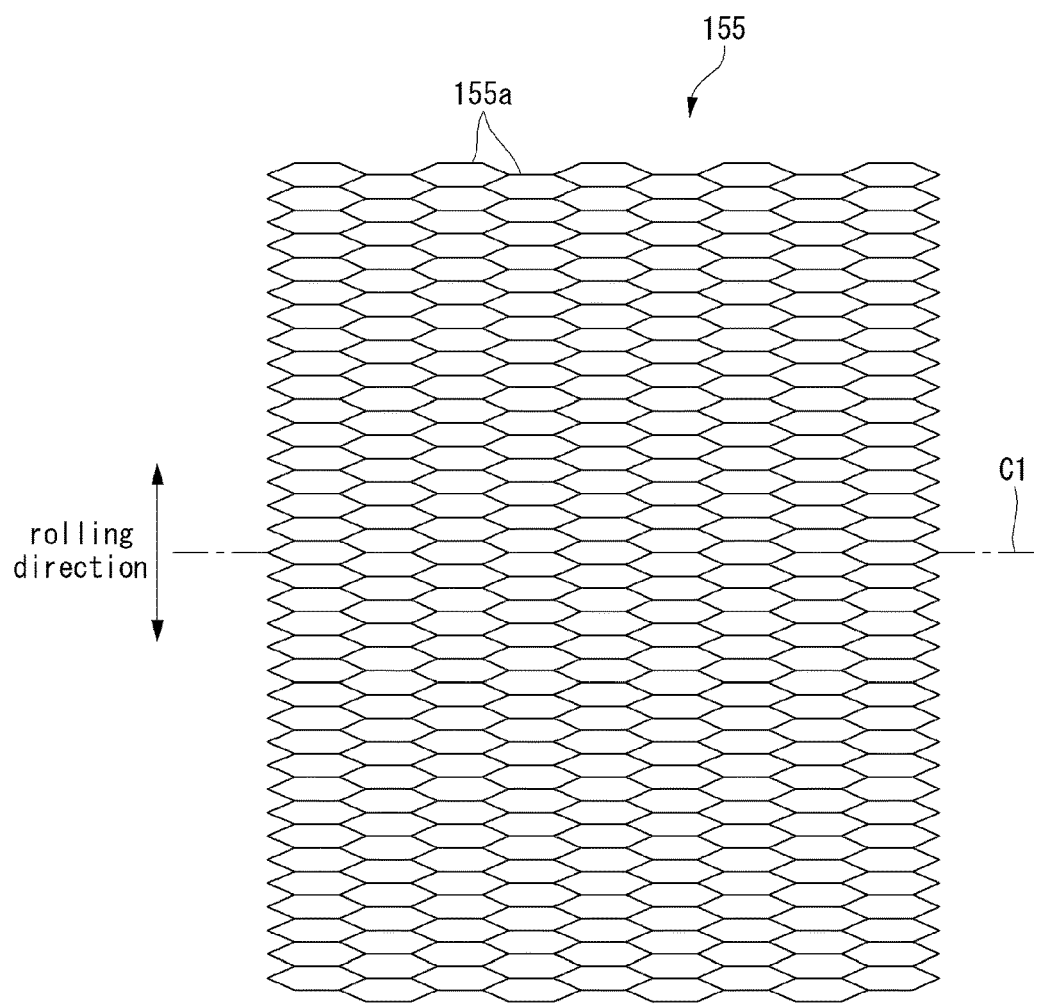
(A)
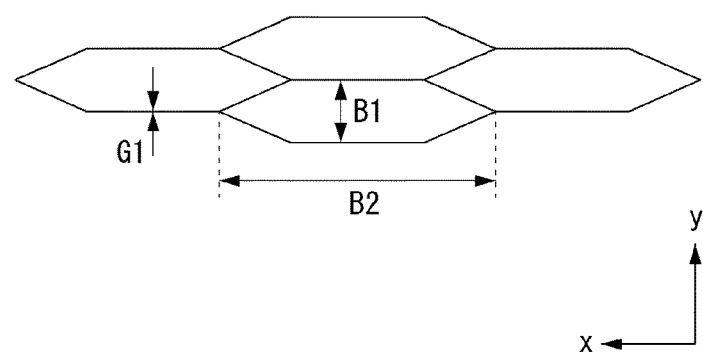

[Fig. 17]
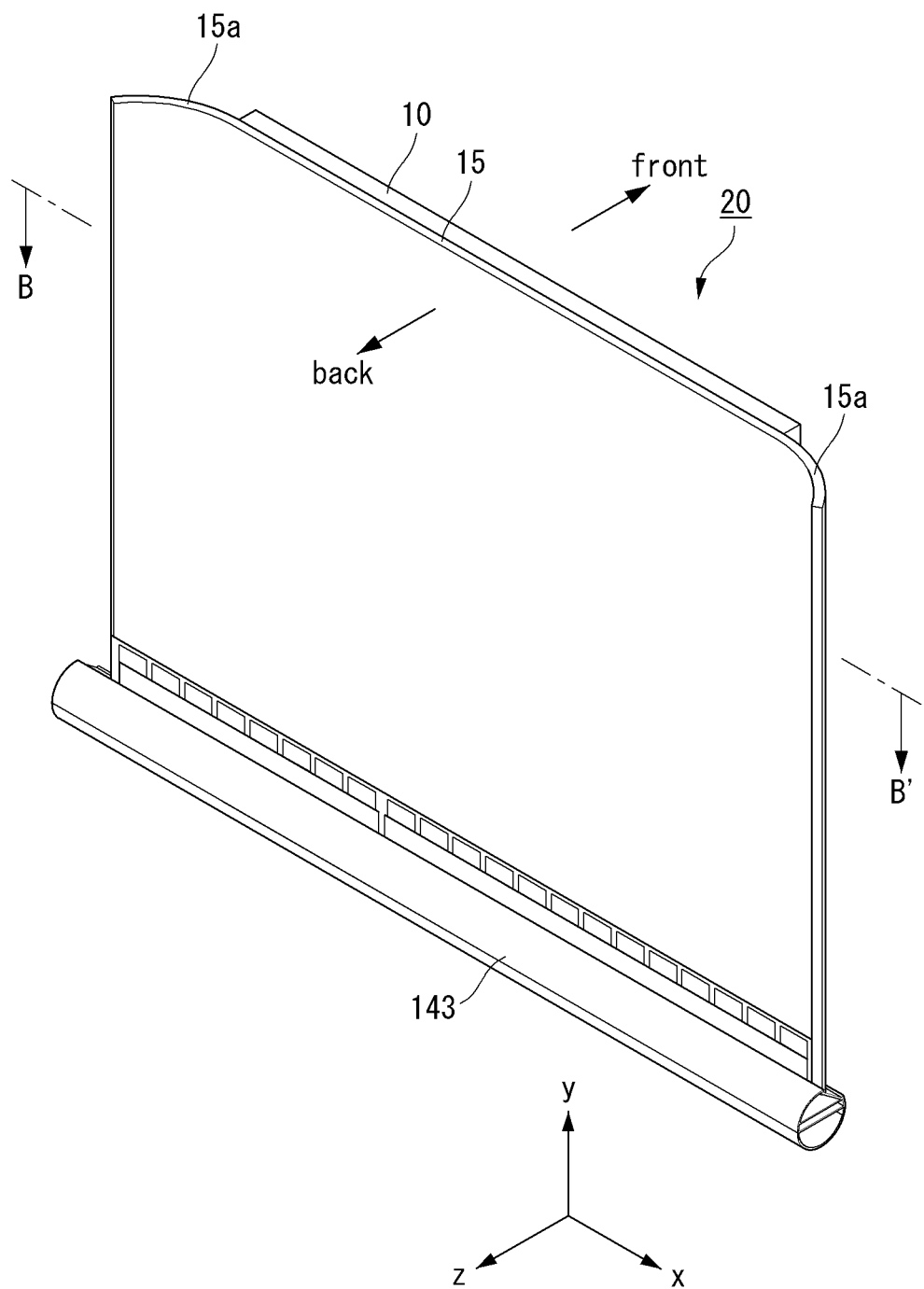

[Fig. 18]
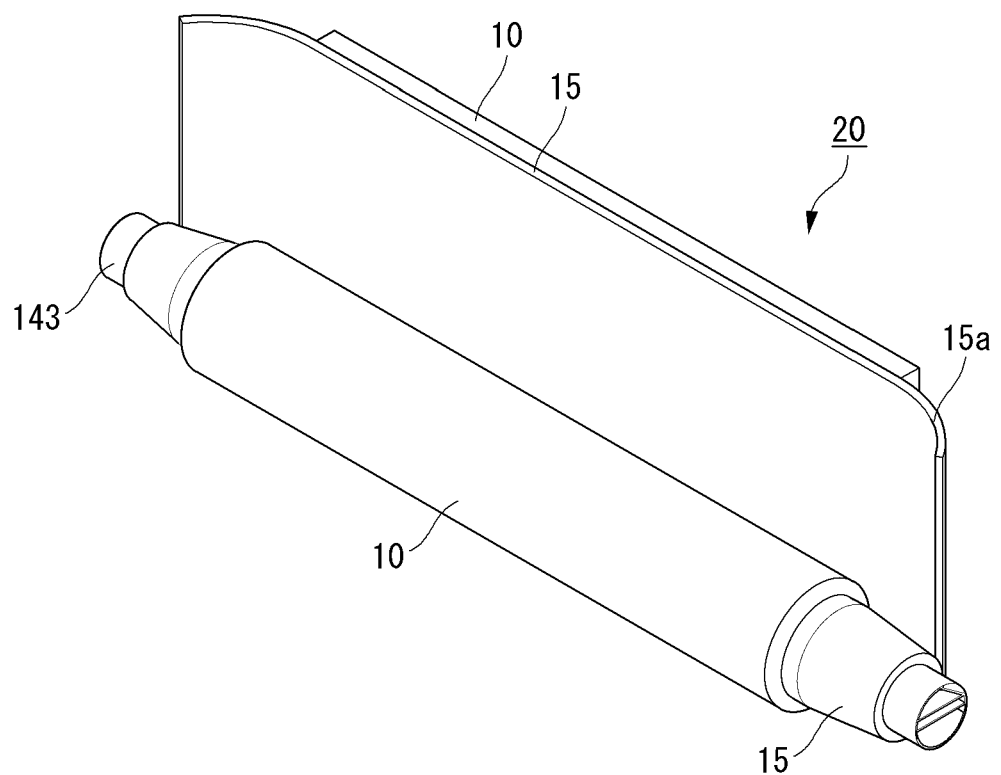

[Fig. 19]
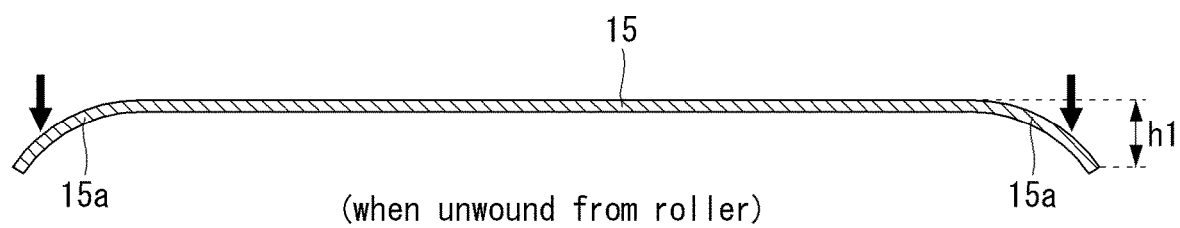
(when unwound from roller)
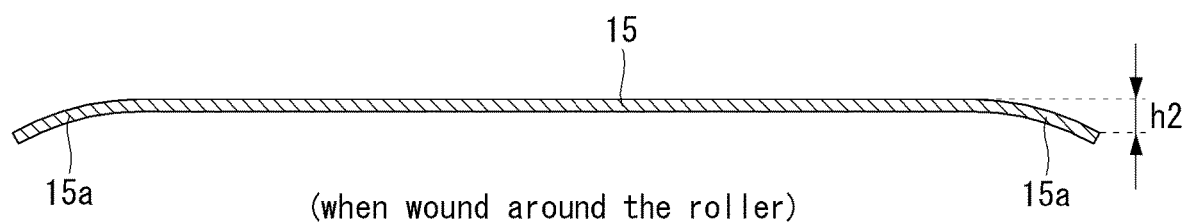
(when wound around the roller)

[Fig. 20]
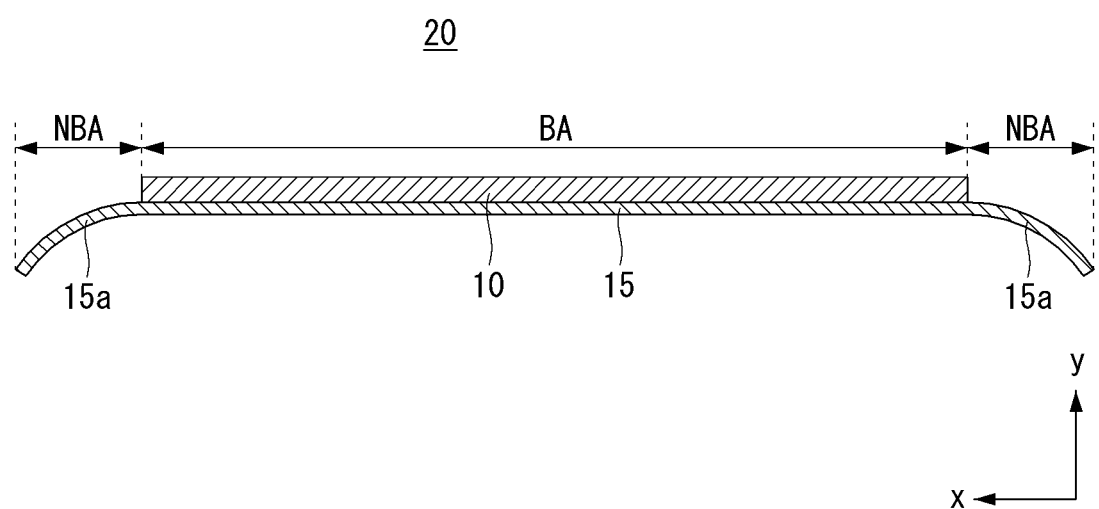
[Fig. 21]
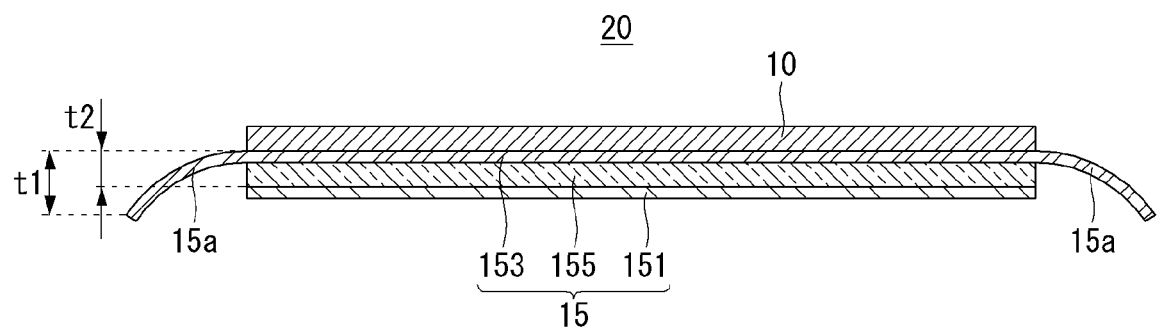

ROLLABLE DISPLAY DEVICE

CROSS REFERENCE TO RELATED APPLICATIONS

This application is the National Phase of PCT International Application No. PCT/KR2019/009407, filed on Jul. 29, 2019, all of which is hereby expressly incorporated by reference into the present application.

TECHNICAL FIELD

The present disclosure relates to a rollable display device on which a display rolls.

BACKGROUND ART

Along with the development of information society, the demand for display devices is increasing in various forms. To meet this demand, various types of display devices such as liquid crystal displays (LCDs), plasma display panels (PDPs), electroluminescent displays (ELDs), and vacuum fluorescent displays (VFDs), have been studied and used in recent years.

Among them, display devices using organic light emitting diodes (OLEDs) are advantageous in that they can be implemented as ultrathin and flexible displays since they have luminance characteristics and viewing angle characteristics, compared to liquid display devices, and require backlight units.

Moreover, flexible displays are applied and used in various fields. For example, they may be implemented as rollable display devices that can be unrolled when the display is in use and that can be rolled up and kept in storage when the display is not in use.

SUMMARY

The present disclosure has been made in an effort to solve the aforementioned problems and other problems.

An aspect of the present disclosure is to provide a module cover that can be used in a rollable display and a rollable display device including the same.

A rollable display device according to an embodiment of the present disclosure may include: a roller; a display part on which the roller rolls and which includes a display panel and a module cover supporting the display panel, the module cover including a bending portion at both end portions of the display part, which bends toward the roller in a second direction intersecting a first direction in which the display part rolls, with a first side facing the roller and a second side facing the display panel having different bending strengths, wherein a first height of the bending portion at which the display part is unrolled from the roller is different from a second height thereof at which the display part is rolled up around the roller.

The second side may be a side where the display panel is joined to the module cover, and the bending strength of the second side may be greater than the bending strength of the first side.

The ratio h1/h2 of the first height h1 and second height h2 of the bending portion may be from 1 to 5.

The module cover may include a first skin and a second skin facing the first skin and having a buckling stress greater than that of the first skin, and the module cover may be joined to the display panel so that the second skin faces the display panel.

The first skin may contain less polymer matrix composites than the second skin or contain no polymer matrix composites.

The difference in buckling stress between the first skin and the second skin may be 10 or greater.

At least one of the first skin and the second skin may contain reinforced fiber, and a first reinforced fiber included in the first skin may be woven in a different way from a second reinforced fiber included in the second skin.

The second reinforced fiber may include first sub skins with original yarns arranged only in a first direction and second sub skins with original yarns woven in a second direction orthogonal to the first direction, wherein the first direction may be the same as the direction in which the display part rolls, and the number of first sub skins may be larger than the number of second sub skins.

The thickness of the second skin may be equal to or larger than that of the first skin and may be equal to or smaller than 1 mm.

The first reinforced fiber may only include a plurality of sub skins woven in the first direction.

The rollable display device may further include a core sandwiched between the first skin and the second skin.

The core may have a honeycomb structure including hexagonal columns, wherein the width of the hexagonal columns in the first direction may be smaller than the width thereof in the rolling direction.

The ratio B2/B1 of the width B2 in the second direction and the width B1 in the first direction may be from 1.5 to 7.

The ratio B1/G1 of the thickness G1 of the hexagonal columns and the width B1 in the first direction may be from 3 to 20.

The thickness of at least one of the first and second skins may be equal to or smaller than the bending strength of the core.

The second skin may be joined to the core by an adhesive layer, and the shore hardness of the adhesive layer may be 80 or smaller.

The bending portion may be selectively formed only on an end portion of the second skin.

The height of the bending portion may be greater than the sum of the thickness of the first skin and the thickness of the core.

The rollable display device may further include: a link assembly including a supporter fixed to an end portion of the display part, an upper link rotatably mounted on the supporter, and a lower link connected to the upper link through a joint; and a motor assembly for rotating the lower link.

Advantageous Effects

The effects of a display device according to the present disclosure will be described below.

According to at least one of the embodiments of the present disclosure, a lightweight, plate-like module cover is provided to make rolling of the display easy.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

BRIEF DESCRIPTION OF THE DRAWINGS

FIG. 1 is a simplified view of the overall appearance of a rollable display device according to an embodiment of the present disclosure.

FIG. 2 is a view illustrating an operation of a rollable display device.

FIG. 3 is a view showing the appearance of a display part connected to a roller.

FIG. 4 is a view schematically showing a cross-section taken along the line A-A' of FIG. 3.

FIG. 5 is a view showing the overall appearance of a rollable display device according to an embodiment.

FIG. 6 is a view showing the appearance of a back of the rollable display device of FIG. 5.

FIGS. 7 and 8 are views showing a link assembly in a folded state.

FIG. 9 is a view showing the appearance of a module cover according to one embodiment.

FIGS. 10 and 11 are views illustrating bending of the module cover.

FIGS. 12 and 13 are views illustrating cross-section structures of a first skin and a second skin, respectively.

FIGS. 14 and 15 are views illustrating the direction of arrangement of reinforced fiber.

FIG. 16 is a view showing a plane pattern of a core.

FIG. 17 is a view showing a display part connected to a roller according to an embodiment.

FIG. 18 is a view showing the display part of FIG. 17 wound around a roller.

FIG. 19 is a view showing cross-sections of the module cover of FIG. 17 when wound around the roller and when unwound from the roller.

FIG. 20 is a view showing the display part of FIG. 17 taken along the line B-B'.

FIG. 21 is a view showing another construction of a bending portion.

DETAILED DESCRIPTION OF THE EMBODIMENTS

Hereinafter, embodiments disclosed in the present disclosure will be described in detail with reference to the accompanying drawings and the same or similar components are denoted by the same reference numerals regardless of a sign of the drawing, and duplicated description thereof will be omitted. Suffixes "module" and "portion" for components used in the following description are given or mixed in consideration of easy preparation of the present disclosure only and do not have their own distinguished meanings or roles. Further, in describing the embodiment of the present disclosure, a detailed description of related known technologies will be omitted if it is determined that the detailed description makes the gist of the embodiment disclosed in the present disclosure unclear. Further, it is to be understood that the accompanying drawings are just used for easily understanding the embodiments disclosed in the present disclosure and a technical spirit disclosed in the present disclosure is not limited by the accompanying drawings and all changes, equivalents, or substitutes included in the spirit and the technical scope of the present disclosure are included.

In addition, in the drawings, for a simplified illustration according to selection, the components of each part may be expressed slightly differently according to the drawings, but the same reference numerals represent the same components.

Hereinafter, a display panel will be described by taking an organic light-emitting display (OLED) as an example. However, display panels applicable to the present disclosure are not limited to liquid crystal panels, but may include flat panel displays that are configured to be bendable, such as liquid crystal display devices (LCDs), plasma display panels (PDPs), or field-emission display panels (FEDs).

Hereinafter, the overall appearance and operation of a rollable display device according to an embodiment of the present disclosure will be described with reference to FIGS. 1 and 2. FIG. 1 is a simplified view of the overall appearance of a rollable display device according to an embodiment of the present disclosure. FIG. 2 is a view illustrating an operating state of the rollable display device.

Referring to FIGS. 1 and 2, the rollable display device 100 according to an embodiment may include a display part 20 and a housing 30.

The display part 20 is a component that displays images, which may be configured to include a display panel 10 and a module cover 15.

The display panel 10 is provided on the front of the display device 100 and displays images. The display panel 10 may split an image into a plurality of pixels and output the image by controlling each pixel to emit light by adjusting the color, brightness, and saturation of each pixel. The display panel 10 may be divided into an active region where an image is displayed and an inactive region where no image is displayed.

The display panel 10 may be rectangular. However, the display panel 10 is not limited to this shape and also may be shaped to have a predetermined curvature at the corners. The display panel 10 may be an organic light-emitting diode (OLED) panel in an exemplary embodiment. However, the present disclosure is not limited to this, and the display panel 10 may be various types of flat panel displays that are bendable.

The module cover 15 may be provided on the back of the display panel 10. The module cover 15 may be attached directly to the display panel 10. The module cover 15 may be the same size as or larger than the display panel 10.

The module cover 15 may support the display panel 10, and also may be attached directly to the back of the display panel 10, with a surface of the module cover 15 facing a surface of the display panel 10, so that the display panel 10 rolls in a stable manner. In an exemplary embodiment, the module cover 15 may be joined to the display panel 10 by an adhesive having a given strength or higher once it is cured. As a result, the display panel 10 and the module cover 15 may be integrated into one assembly and operate as a single body.

This module cover 15 may be configured to raise or lower the display part 20 and to bend well or not depending on the direction. To this end, the module cover 15 will be described in detail later.

The housing 30 may hold the display panel 10 in it, and multiple mechanical components for raising the display part 20 and driving circuits required to drive the display part 20 may be mounted inside it.

The rollable display device 100 may operate in a first state and a second state. The first state is a state in which the active region of the display part 20 is positioned inside the housing 30, and the second state is a state in which the active region of the display part 20 is exposed out of the housing 30. Or else, the first state may be a state in which the display part 20 is held inside the housing, and the second state may be a state in which the display part 20 is unrolled.

When the rollable display device 100 is in the first state, the active region of the display part 20 may be positioned inside the housing 30. That is, this means that the display part 20 may be covered by the housing 30.

The rollable display device 100 maintains the first state when it does not operate or no screen appears on the display, and maintains the second state when it operates or a screen appears on the display.

In an embodiment, the rollable display device 100 may further include a roller 143 for raising the rollable display device 100. The roller 143 is configured to rotate clockwise or counterclockwise within the housing 30. One end of the display part 20 is connected to the roller 143, and may be unfolded out of the housing 30 or held inside the housing 30 as the display part 20 is raised by the rotation of the roller 143.

Otherwise, in the first state, the display part 20 is rolled up around the roller 143, and in the second state, the display part 20 is unrolled from the roller 143 and exposed. A detailed structure and operation method of the display part 20 will be described below.

As such, in the rollable display device 100 according to an embodiment, the display part 20 may be in either the first state or the second state. Accordingly, the display part 20 may be exposed out of the housing 30 only when the display device 100 is in use, thereby saving space.

Hereinafter, the configuration of the display part 20 and the roller 143 will be described in detail with reference to FIGS. 3 and 4. FIG. 3 is a view showing the display part being connected to the roller. FIG. 4 is a view schematically showing a cross-section taken along the line A-A' of FIG. 3.

Referring to FIGS. 3 and 4, in the rollable display device according to an embodiment, the roller 143 may be connected to one end of the display panel 10. The display panel 10 may be wound or unwound so that the display panel 10 is in either a first state or a second state. The roller 143 may be configured to rotate in the arrow direction (clockwise) and raise the display part 20 and to rotate counterclockwise and lower the display part 20. In an example, when the roller 143 operates in this manner, the display part 20 may be disposed in such a way that the front faces the −z axis and the back faces the +z axis. In this case, the display part 20 may be wound in such a way that the front where images are displayed faces the roller 143 outward. By winding the display part 20 in this way, when the display part 20 is raised out of the housing 30, it is positioned in proximity to corners of the housing 30 to raise the display part 20. Thus, a space for containing an object above the housing 30 in front of the screen of the display part 20 is eliminated, thereby preventing the screen from being blocked by the object positioned above the housing in front of the screen.

Alternatively, on the contrary, the display part 20 may be disposed in such a way that the front faces the +z axis and the back faces the −z axis.

In the rollable display devices according to one embodiment, source PCBs 120 may be disposed on at least part of the back (inside where the display panel 10 is wound around the roller) of the display part 20. Each of the source PCBs 120 may be spaced apart from neighboring ones.

Signal lines for transmitting digital video data and timing control signals, which are transmitted from the timing controller board 105, may be disposed on at least one source PCB 120. The source PCB 120 may be connected to the display panel 10 by a source COF (chip on film 123). The source COF 123 connected to one side of the source PCB 120 may be extended to the active region of the display panel 10 and connected to the display panel of the display part 20.

A mounting portion 379 may be formed on an outer circumference of the roller 143. The mounting portion 379 may be formed in such a way that part of the outer circumference of the roller 143 is stepped, in which case a receiving space B may be formed inside the roller 143. The mounting part 379 may be positioned where the PCB 120 adjoins the roller 143 when the display part 20 is wound around the roller 143.

When the display part 20 is rolled up, the source PCB 120 may be received in the receiving space B formed by the mounting portion 379. Accordingly, it is possible to prevent damage to the source PCB 120 when the roller 143 is rolled up.

A timing controller board 105 may be mounted inside the roller 143. The timing controller board 105 and the source PCB 120 may be electrically connected by an FFC cable 117.

The roller 143 may include two bodies, rather than a single body, that is, an upper roller 331 and a lower roller 337. The upper roller 331 and the lower roller 337 may be assembled together by various methods without any restraint. For example, they may be screwed together.

The timing controller board 105 may be mounted between the upper roller 331 and the lower roller 337. The FFC cable 117 may be connected to the timing controller board 105 and the source PCBs 120 through a hole 331*a* positioned in the upper roller 331.

With this configuration, the timing controller board 105 rotates together with the roller 143, thereby preventing the FFC cable 117 from being entangled. Also, the timing controller board 105 is mounted inside the roller 143, thereby saving space.

Moreover, a main board and a power supply may be disposed inside the housing to drive the display part 20. For example, they may be mounted on an inner wall surface of the housing. The timing controller board 105 may be connected to the main board and the power supply through wiring.

Hereinafter, a construction for raising the display part 20 will be described with reference to FIGS. 5 and 6. FIG. 5 is a view showing the overall appearance of a rollable display device according to an embodiment. FIG. 6 is a view showing the appearance of a back of the rollable display device of FIG. 5.

In an embodiment, the rollable display device 100 may include a link assembly LA for raising the display part 20.

The link assembly LA may be driven by a motor. In the first state, the link assembly LA may be bent and positioned inside the housing 30 so that the display part 20 is positioned inside the housing 30 while wound around the roller 143, and, in the second state, the display part 20 may be unfolded and come out of the housing 30.

Meanwhile, the housing 30 may function as a mounting where the link assembly LA and the motor assembly 137 are installed, to thereby support the link assembly LA and the motor assembly 137.

The housing 30 includes a first base 31 and a second base 33, and the first base 31 and the second base 33 may face each other, with a predetermined distance between them. For reference, FIG. 5 illustrates the housing 30 from which the first base 31 is omitted to make the roller 143 visible.

The roller 143 may be disposed between the first base 31 and the second base 33, and both ends thereof may be axially connected to the housing 30 so as to rotate clockwise or counterclockwise. Accordingly, the roller 143 may rotate with respect to the central axis of the roller.

The link assembly LA may be disposed above the first base 31. The link assembly LA may function to give support so that the display part 20 is raised or lowered. The link assembly LA may raise or lower a supporter 75 attached to the top of the display part 20.

An upper end of the display part 20 may be fixed to the supporter 75, and a lower end thereof may be fixed to the roller 143. When the link assembly LA is unrolled (or unfolded), the display part 20 may be supported on the back so that the display part 20 is unfolded neatly without folds.

The motor assembly 137 may be positioned where the link assembly LA is connected to the housing 30. The motor assembly 137 may be driven to raise or lower the link assembly LA. The motor assembly 137 may receive an electric signal and convert it into a physical force. The motor assembly 137 may transmit rotational energy to the link assembly LA to change it from the first state to the second state.

The link assembly LA may include the supporter 75 and a pair of links 73 supporting both sides of the supporter 75.

The supporter 75 fixes ends of the display part 20. Accordingly, the display part 20 may be raised in concert with the raising operation of the supporter 75.

The link 73 may include an upper link 73a and a lower link 73b, and may have a bar shape. The upper link 73a may be disposed at an upper portion, and the lower link 73b may be disposed at a lower portion.

The upper ink 73a and the lower link 73b may be connected through a joint 152. One end of the upper link 73a may be fastened to the supporter 75, and the other end of the upper link 73a may be fastened to the joint 152. Also, one end of the lower link 73b may be rotatably and axially connected to the motor assembly 137, and the other end of the lower link 73b may be fastened to the joint 152.

The joint 152 may include gears (not shown) that are installed at the upper link 73a and the lower link 73b, respectively. The gear of the upper link 73a and the gear of the lower link 73b may engage each other. Thus, the links 73 may be configured to move symmetrically with respect to the joint 152.

Such a link 73 may be provided on each of the left and right sides, and may operate as a pair. That is, the display part 20 may be raised in an upright position without tilting or creasing only when the left link and the right link are controlled to have the same momentum.

With this in consideration, in an embodiment, the link assembly LA may further include a shock absorber 72 supporting the link 73. One end of the shock absorber 72 may be rotatably and axially connected to the link 73, more precisely, the lower link 73b, and the other end may be rotatably and axially connected to the first base 31. In an exemplary embodiment, the shock absorber 72 may include an oil hydraulic cylinder, a pneumatic cylinder (or an air cylinder), or an actuator. The shock absorber according to this construction may include a piston and a cylinder, and the cylinder may be filled with oil or gas.

Hereinafter, an operation of the link assembly LA will be described with reference to FIGS. 6 to 8. FIGS. 7 and 8 are views showing a link assembly in a folded state.

In the rollable display device 100 according to an embodiment, the links 73 may perform a rotating/pivoting motion by the operation of the motor assembly 137, and, as a result, the supporter 75 may be raised.

The motor assembly 137 may operate so that the links 73 rotate or pivot in a direction in which they stand upright with respect to the base 31, by a gear construction (not shown) disposed between the motor assembly 137 and the lower link 73b.

For example, the angle between the upper link 73a and the lower link 73b which are connected by the joint 152 as the axis of the motor assembly 137 rotates may be increased or decreased. Such an operation for decreasing or increasing the angle between the upper link 73a and the lower link 73b with respect to the joint as the upper link 73a and the lower link 73b are folded and unfolded may be referred to as a pivoting operation.

As the links 73 pivot, a top case may move toward the +y axis. Thus, the display part 20 whose one end is connected to the top case may be raised upward as it is unwound from the roller 143.

As the links 73 pivot in a direction in which they stand upright with respect to the base 31, the length of the shock absorber 72 varies. When the links 73 are unfolded, the shock absorber 72 whose one end is connected to the lower link 73b is extended lengthwise, which increases oil pressure and support the links 73 to maintain an upright position.

When the motor assembly 137 pivots the lower link 73b in a direction (clockwise) opposite to the direction in which the lower link 73b stands upright with respect to the base 31, the angle between the lower link 73b and the upper link 73a is decreased. As a result, the supporter 75 can be lowered toward the −y axis, and part of the display part 20 can be wound around the roller 143. Also, as the motor assembly 137 pivots the lower link 73b in a direction opposite to the direction in which the lower link 73b stands upright with respect to the base 31, the length of the shock absorber 72 can be decreased.

As such, as the lower link 73b rotates clockwise or the links 73 pivot, the distance between the joint of the left link and the joint of the right link can become smaller. When the distance is minimum, the display part 20 can be completely contained in the housing. On the contrary, when the distance between the joint of the left link and the joint of right link is maximum, the links 73 can be brought to a fully upright position (90 degrees between the links and the base), thereby fully unfolding the display part 20.

Hereinafter, the module cover 15 according to an embodiment will be described in more details with reference to FIG. 9. FIG. 9 is a view showing the appearance of a module cover according to an embodiment.

In FIG. 9, the module cover 15 according to an embodiment may be configured to have the shape of a thin plate. The module cover 15 may have a thickness of about 1 mm to 2 mm, and may vary with the size of the display panel 10. For example, the thickness of the module cover 15 may become smaller as the size of the display panel 10 becomes smaller, and, on the contrary, the thickness of the module cover 15 may become larger as the size of the display panel 10 becomes larger. Also, the thickness of the module cover 15 may be adjusted according to its structural stiffness. The thickness may be increased to increase the structural stiffness, and on the contrary, the thickness may be decreased to decrease the structural stiffness.

Moreover, the thickness of the module cover 15 may be adjusted depending on the size of the roller 143, more precisely, the diameter of the roller 143 which is cylindrical. For example, if the diameter of the roller 143 is increased, the radius of curvature required for the display part 20 is increased that much and therefore the thickness of the module cover 15 may become larger. On the contrary, if the diameter of the roller 143 becomes smaller, the radius of curvature required for the display part 20 becomes smaller proportionally.

The module cover 15 according to an embodiment may have a sandwich structure. The sandwich structure has the advantages of light weight and high structural stiffness because it is made by putting a lightweight core between two outer plates.

The module cover 15 according to an embodiment may include a first skin 151 and a second skin 153 facing the first skin 151, and a core 155 disposed between them. Here, the core 155 is not an essential component, and the core 155 may be omitted as long as the structural stiffness permits.

The first skin 151 may have, but not limited to, a thickness of about 0.1 to 0.3 mm, and its thickness may be adjusted in consideration of structural stiffness, bending strength, or buckling stress.

Preferably, the first skin 151 may have a lower bending strength or buckling stress than the second skin 153 so as to enable bending in one direction. The lower the bending strength or buckling stress, the better the skins bend and roll. In an exemplary embodiment, the difference in buckling stress between the first skin 151 and the second skin 153 is preferably 10 or greater. If the difference in buckling stress is 10 or greater, the display part 20 may be unfolded without a hitch such as creases or wrinkles.

In contrast, the second skin 153 may have a different bending strength or buckling stress from the first skin 151 so that the module cover 15 bends in one direction. For example, the greater the difference in bending strength or buckling stress between the first skin 151 and the second skin 153, the better they bend and roll.

With this in consideration, the thickness of the second skin 153 may be at least equal to or smaller than the thickness of the first skin 151. The bending strength or buckling stress tends to increase in proportion to the thickness. Thus, if one skin has higher bending strength and the other skin has lower bending strength, the bending strength may roll smoothly toward the skin having the lower bending strength.

This will be described with reference to FIG. 10. In the module cover 15 according to an embodiment, the buckling stress of the first skin 151 may be lower than the buckling stress of the second skin 153. For example, the difference in buckling stress between the first skin 151 and the second skin 153 may be 10 or greater.

The buckling stress of the first skin 151 disposed in the first direction is relatively much lower than the buckling stress of the second skin 153 disposed in the second direction. In this state, when the module cover 15 is bent in a first direction (or counterclockwise), the bending occurs with respect to the first skin 151 (the first skin is positioned on the inside and the second skin is positioned on the outside, with respect to the axis of rotation), the bending in the first direction may occur easily.

On the contrary, if the module cover 15 bends in a second direction (or clockwise), the bending occurs with respect to the first skin 151 (the second skin is positioned on the inside and the first skin is positioned on the outside, with respect to the axis of rotation), the bending in the second direction may occur less than the bending in the first direction.

Moreover, the first skin 151 constituting the module cover 15 may be made inextensible so as not to bend in the second direction. If the module cover 15 bends clockwise (or in the second direction), the first skin 151 may be subject to tension. Accordingly, if the first skin 151 is extensible, the module cover 15 may bend clockwise.

However, in an example, since the first skin 151 is inextensible, the module cover 15 may bend in the first direction but not in the second direction.

Meanwhile, as illustrated in FIG. 11, the module cover 15 thus constructed may be joined to the display panel 10 so that the second skin 153 faces the display panel 10. More precisely, the display panel 10 and the module cover 15 may be attached together, with the back of the display panel 10 and the second skin 153 of the module cover 15 facing each other.

As a result, when the roller 143 rotates clockwise, the display part 20 bends with respect to the first skin 151, allowing the display part 20 to be rolled around the roller 143. On the contrary, when the roller 143 rotates counterclockwise, the display part 20 may be unwound from the roller 143 and raised. Also, once the module cover 15 is fully unfolded, the display part 20 may be prevented from bending in the second direction because of the first skin 151 which is inextensible in the second direction. Accordingly, when fully unfolded, the display part 20 may be unfolded flat by the support force in the second direction.

In an exemplary embodiment, the first skin 151 may contain less polymer matrix composites than the second skin 153 or contain no polymer matrix composites. Since the polymer matrix composites function to increase stiffness or hardness, the first skin 151 whose bending strength or buckling stress is relatively smaller than the first skin 151 may contain less polymer matrix composites than the second skin 153, or the first skin 151 may contain no polymer matrix composites.

As the second skin 153 contains polymer matrix composites, its weight may be lessened and its stiffness may be increased, thereby preventing the display part 20 from bending (or falling forward) in the second direction.

Moreover, at least one of the first skin 151 and the second skin 153 may be made of reinforced fiber as a main component. As for the main component, the proportion of reinforced fiber is 50 (wt %) or greater, and, more preferably, the proportion of reinforced fiber may be 90 (wt %) or greater. Here, the reinforced fiber includes glass fiber or carbon fiber.

At least one of the first skin 151 and the second skin 153 is configured to include reinforced fiber. Thus, when the display part 20 is wound around the roller 143 and then unwounded from it, the display part 20 may be easily unrolled due to intrinsic elastic restoring force.

In addition, in an embodiment, a first reinforced fiber included in the first skin 151 may be woven in a different way from a second reinforced fiber included in the second skin 153. This will be described in detail with reference to FIGS. 12 to 15. FIGS. 12 and 13 are views illustrating cross-section structures of a first skin and a second skin, respectively. FIGS. 14 and 15 are views illustrating the direction of arrangement of reinforced fiber.

Referring to these drawings, the first skin 151 and the second skin 153 may have a cross-section structure in which a plurality of sub skins are laminated. Here, each layer of the skins 151 and 153 may be classified according to the direction in which original yarns of reinforced fiber, for example, carbon yarns, are woven.

For example, the first skin 151 may be made up of a plurality of layers formed by weaving carbon yarns only in one direction. In the drawings, "x" indicates that carbon yarns are woven in a first direction.

As exemplified in FIG. 12, the first skin 151 may be made up of a plurality of sub skins 151*a*, and the carbon yarns of each layer may be arranged only in the first direction.

Also, for example, the second skin 153 may include first sub skins 153a with carbon yarns woven only in the first direction and second sub skins 153b with carbon yarns woven in a second direction orthogonal to the first direction. In the drawings, "+" indicates that carbon yarns are woven in the second direction.

In an exemplary embodiment, the second skin 153 may further include second sub skins 153b woven in the second direction since it is required to have higher buckling stress than the first skin 151. More preferably, the second skin 153 may be formed in such a way that the number of second sub skins 153b is larger than the number of first sub skins 153a. Here, the first sub skins 153a and the second sub skins 153b are laminated or arranged freely without being limited to any specific order or arrangement. For example, the first sub skins 153a and the second sub skins 153b may be arranged in an alternating fashion, or a plurality of first sub skins 153a may be laminated and then a plurality of second sub skins 153b may be laminated thereon, thereby forming the second skin 153.

With this configuration, the second skin 153 may bend more easily with respect to the second direction than with respect to the first direction, and therefore may have a support force in the second direction.

Meanwhile, FIGS. 14 and 15 are views showing the direction of arrangement of original yarns of the first sub skins 153a and the second sub skins 153b.

The first sub skins 153a may be a layer at which the original yarns 153a1 are all arranged in the first direction (the y-axis direction in the drawings). Accordingly, the original yarns 153a1 may be weft yarns between warp yarns and weft yarns.

Also, the second sub skins 153b may be a layer at which the original yarns 153b1 are arranged only in the second direction (the x-axis direction in the drawings) orthogonal to the first direction. Accordingly, the original yarns 153b1 may be warp yarns.

By the way, the bending strength of the first sub skins 153a in the first direction may be much greater than the bending strength thereof in the second direction. In other words, the first sub skins 153a may easily deform in the first direction which is along the axis V1 since the original yarns 153a1 are arranged in the first direction, whereas it may be difficult for the first sub skins 153a to bend in the second direction which is along the axis V2.

Accordingly, when the display part 20 rolls in the first direction, it may be difficult for the first sub skins 153a to bend in the rolling direction, and the second sub skins 153b may bend easily in the rolling direction.

Consequently, if the original yarns of each sub skin constituting the first skin 151 are arranged in a direction orthogonal to the rolling direction, the first skin 151 may bend easily in the rolling direction.

On the other hand, the second skin 151 does not bend easily compared to the first skin 151, because the original yarns are disposed in a complex way in the first and second directions. However, the second skin 153 has sub skins including original yarns arranged in the same direction as the rolling direction of the display part 20, which causes a build-up of elastic restoring force when the display part 20 bends. Accordingly, when the display part 20 is unfolded, it may be elastically unrolled, and, as a result, creases or wrinkles formed when the display part 20 is unfolded may be prevented.

With this in consideration, in the second skin 153, the number of first sub skins 153a and the number of second sub skins 153b may be different, and, more preferably, the number of sub skins arranged in the same direction as the rolling direction of the display part 20 may be larger than the number of other sub skins.

In one configuration, the skins 151 and 153 include a plurality of sub skins with original yarns arranged in one direction. Thus, the properties of layers required for each skin, such as bending strength or buckling stress, may be easily implemented.

Hereinafter, the core constituting the module cover 15 will be described in detail with reference to FIG. 16. FIG. 16 is a view showing a plane pattern of the core, in which (A) shows an enlarged view of part of the honeycomb.

In one configuration, the core 155 may be constructed of a honeycomb structure which is configured as a set of hexagonal columns 155a for structural stiffness.

The core 155 may include hexagonal columns 155a whose horizontal to vertical ratio is high so that the display part 20 is folded or unfolded as it rolls in the rolling direction (the y-axis direction in the drawings).

Here, as illustrated in the drawings, the rolling direction is the first direction (the y-axis direction in the drawings), for example. If the rolling direction is the first direction, this means that the display part 20 winds or unwinds with respect to the axis C1 of rotation in the second direction.

Assuming that the rolling direction of the display part 20 is the first direction (the y-axis direction in the drawings), it is preferable that the width B2 of the hexagonal columns 155a in the second direction is larger than the width B1 thereof in the first direction. In this instance, the height of the hexagonal columns 155a is not taken into consideration to identify the relationship between the width B2 in the second direction and the width B1 in the first direction.

More preferably, the ratio B2/B1 of the width B2 in the second direction and the width B1 in the first direction may be from 1.5 to 7. In other words, the width B2 in the second direction may be a minimum of 1.5 times the width B1 in the first direction and a maximum of 7 times the width B1. If the width B2 in the second direction is smaller than a minimum of 1.5 times the width B1 in the first direction, the display part 20 may not bend with a desired radius of curvature due to the structural stiffness of the core 155. Also, if the width B2 in the second direction is larger than 7 times the width B2 in the first direction, the structural stiffness of the core 155 may be too low to maintain shape.

Moreover, the ratio B1/G1 of the thickness G1 of the hexagonal columns 155a and the width B1 in the first direction may be from 3 to 20. In other words, the thickness G1 may be a maximum of ⅓ of the width B1 in the first direction and a minimum of ¹⁄₂₀ of the width B1 in the first direction.

If the column thickness G1 is smaller than ¹⁄₂₀ of the width B1 in the first direction, the columns are too thin to obtain enough structural stiffness for maintaining shape. Even if the column thickness G1 is larger than ⅓ of the width B1 in the first direction, the structural stiffness is too high, making it practically impossible to bend the display part 20 in the rolling direction.

The first skin 151 may be joined to one side of the thus-constructed core 155, and the second skin 153 may be joined to the other side so as to face the first skin 151. Here, the skins 151 and 153 may be joined to the core 155 through an adhesive layer. In this case, the shore hardness of the adhesive layer may be preferably 80 or smaller. If the shore hardness of the adhesive layer is greater than 80, it may be difficult to roll the display part 60 around the roller 143.

In addition, the thickness of the skins 151 and 153 may be equal to or smaller than 1% of the bending strength of the core. If the thickness of the skins 151 and 153 is larger than 1% of the bending strength of the core, the stiffness of the skins or the thickness of the skins becomes larger, which may make it difficult to roll the display part 60 around the roller 143 due to the strength of the skins 151 and 153.

Hereinafter, another embodiment of the display part 20 will be described with reference to the accompanying drawings. FIG. 17 is a view showing the overall appearance of a display part according to another embodiment. FIG. 20 is a view showing the display part of FIG. 17 taken along the line B-B'.

Referring to these drawings, the display part 20 according to this embodiment may include a module cover 15 including a bending portion 15a and a display panel 10 joined to one side of the module cover. The same configuration as the above-described module cover may apply to the module cover 15.

The module cover 15 of this embodiment may further include a bending portion 15a so that the module cover 15 has elastic restoring force. Assuming that the rolling direction of the display part 20 is the first direction (the y-axis direction in the drawings), the bending portion 15a may be formed by bending both ends of the module cover 15 in the second direction (the x-axis direction in the drawings) in one direction.

Accordingly, the module cover 15 and 20 may be divided up into a bonding area BA and a non-bonding area NBA. Here, the bonding area BA may be an area with a flat surface where the display panel 10 is bonded, and the non-bonding area NBA may correspond to both ends of the module cover 15 where the display part 10 is not bonded. The bending portion 15a may be formed in the non-bonding area NBA.

The bending portion 15a may be formed in such a way that the module cover 15 is curved with a certain radius of curvature, or may be formed in such a way that an end portion thereof is bent at a certain angle. Moreover, the bending portion 15a may be formed in various ways without being limited to any particular shape, apart from the shape exemplified in the drawings, as long as it has elastic restoring force. Additionally, although the bending portion 15a is configured as part of the module cover 15, a separate material may be added to the module cover 15.

In an exemplary embodiment, the bending part 15a may be formed by bending the first skin, second skin, and core of the module cover 15 altogether, or may be formed by selectively bending the second skin 153 alone which has the highest elastic restoring force (see FIG. 21). In this instance, the height t1 of the bending portion 15a may be greater than the sum t2 of the thickness of the core 155 and the thickness of the first skin 151. According to an example, the display panel 10 may be joined to face the second skin 155, so that the display part 20 may be rolled around the roller 143 (outward folding). Accordingly, it is necessary for the bending portion 15a to be bent toward the first skin 151 so as to have elastic restoring force, and therefore the height t1 of the bending portion 15a should be greater than the sum t2 of the thickness of the core 155 and the thickness of the first skin 151.

Moreover, it is preferable that the bending portion 15a is bent toward the roller 143 so as to have elastic restoring force when wound around the roller 143. FIG. 19 illustrates the module cover 15 when wound around the roller and when unwound from the roller.

When the module cover 15 is unwound from the roller, the bending portion 15a may have a first height h1. In this state, no deforming force may be exerted on the bending portion 15a. Here, the height h1 of the bending portion 15a refers to the linear height from the roller 143 to the module cover 15.

Also, when the module cover 15 is bent around the roller, the deforming force (indicated by the arrow in the drawing) on the bending portion 15a is continuously exerted toward the roller 143 while the display part 20 is rolled around the roller 143. Thus, the second height h2 of the bending portion 15a is decreased compared to when in the first state. Meanwhile, the bending portion 15a may store this deforming force as elastic restoring force, and the display part 20 may function to stand upright by itself when unfolded.

In an exemplary embodiment, the ratio h1/h2 of the first height h1 when the bending portion 15a is unrolled from the roller and the second height h2 when the display part is rolled up around the roller may be 1 to 5. In other words, the first height h1 of the bending portion 15a may be a minimum of the second height h2 and a maximum of five times the second height h2. If the first height h1 of the bending portion 15a is equal to or smaller than the second height h2, no deforming fore is exerted on the bending portion 15a, and if the first height h1 of the bending portion 15a is five times the second height h2 or greater, the yield strain of the bending portion 15a may be exceeded due to the deforming force exerted on the bending portion 15a.

The display part 20 of this embodiment stores elastic restoring force when the display part 20 is wound (see FIG. 18) around the roller 143 due to the bending portion 15a, and increases the self-standing stiffness of the display part 20. Therefore, the display part 20 may be easily unfolded, or the display part 20 may be raised only by rotating the roller without mechanical assistance such as of the above-described link assembly.

The aforementioned embodiments of the disclosure are not exclusive or different. The elements or functions of each of the aforementioned embodiments of the disclosure may be used in combination with or combined with each other.

The detailed description should not be construed as being limitative, but should be considered to be illustrative from all aspects. The scope of the disclosure should be determined by reasonable analysis of the attached claims, and all changes within the equivalent scope of the disclosure are included in the scope of the disclosure

The invention claimed is:

1. A rollable display device comprising:
   a display part including a display panel and a module cover supporting the display panel; and
   a roller configured to roll and unroll the display part into and out of a housing,
   wherein the module cover includes:
      a bonding portion joining the display panel to the module cover; and
      elastic bending portions at both ends of the bonding portion of the display part, and bending toward the roller,
      wherein when the display part is unrolled from the roller and exposed outside of the housing, the elastic bending portions elastically bend to have a first height,
      wherein when the display part is rolled around the roller, and positioned inside the housing, the elastic bending portions elastically bend to have a second height that is less than the first height, and
   wherein the module cover further comprises:
   a first skin facing the roller;
   a second skin facing the display panel; and
   a core portion sandwiched between the first skin and the second skin, wherein the second skin has a buckling stress greater than a buckling stress of the first skin.

2. The rollable display device of claim 1, wherein the module cover comprises:
   a first side facing the roller;
   a second side facing the display panel; and
   a core portion sandwiched between the first side and the second side, and
   wherein a bending strength of the first side is different than a bending strength of the second side.

3. The rollable display device of claim 2, wherein the bending strength of the second side is greater than the bending strength of the first side.

4. The rollable display device of claim 1, wherein a ratio h1/h2 of the first height h1 and the second height h2 of the bending portion is from 1 to 5.

5. The rollable display device of claim 1, wherein the first skin contains less polymer matrix composites than the second skin or contains no polymer matrix composites.

6. The rollable display device of claim 1, wherein the difference in buckling stress between the first skin and the second skin is 10 or greater.

7. The rollable display device of claim 5, wherein at least one of the first skin and the second skin contains reinforced fiber.

8. The rollable display device of claim 7, wherein a first reinforced fiber included in the first skin is woven in a different way from a second reinforced fiber included in the second skin.

9. The rollable display device of claim 8, wherein the second reinforced fiber comprises first sub skins with original yarns arranged only in a first direction and second sub skins with original yarns woven in a second direction orthogonal to the first direction, and
   wherein the first direction is the same as the direction in which the display part rolls, and the number of first sub skins is larger than the number of second sub skins.

10. The rollable display device of claim 8, wherein the first reinforced fiber only comprises a plurality of sub skins woven in the first direction.

11. The rollable display device of claim 6, wherein a thickness of the second skin is equal to or larger than a thickness of the first skin and is equal to or smaller than 1 mm.

12. The rollable display device of claim 1, wherein the core portion has a honeycomb structure comprising hexagonal columns, and
   wherein a width of the hexagonal columns in a first direction corresponding to rolling direction is smaller than a width of the hexagonal columns in a second direction perpendicular to the first direction.

13. The rollable display device of claim 12, wherein a ratio B2/B1 of the width B2 in the second direction and the width B1 in the first direction is from 1.5 to 7.

14. The rollable display device of claim 12, wherein a ratio B1/G1 of a thickness G1 of the hexagonal columns and the width B1 in the first direction is from 3 to 20.

15. The rollable display device of claim 12, wherein a thickness of at least one of the first and second skins is equal to or smaller than a bending strength of the core portion.

16. The rollable display device of claim 1, wherein the second skin is joined to the core portion by an adhesive layer, and a shore hardness of the adhesive layer is 80 or smaller.

17. The rollable display device of claim 1, wherein the bending portions are formed only on end portions of the second skin.

18. The rollable display device of claim 1, wherein a height of the elastic bending portions is greater than a sum of a thickness of the first skin and a thickness of the core.

19. The rollable display device of claim 1, further comprising:
   a link assembly including a supporter fixed to an end portion of the display part, an upper link rotatably mounted on the supporter, and a lower link connected to the upper link through a joint; and
   a motor assembly for rotating the lower link.

* * * * *